United States Patent
Hu

(10) Patent No.: US 9,543,156 B1
(45) Date of Patent: Jan. 10, 2017

(54) METHOD FOR GROWING GRAPHENE ON SURFACE OF GATE ELECTRODE AND METHOD FOR GROWING GRAPHENE ON SURFACE OF SOURCE/DRAIN SURFACE

(71) Applicant: Shenzhen China Star Optoelectronics Technology Co., Ltd., Shenzhen (CN)

(72) Inventor: Tao Hu, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 14/778,089

(22) PCT Filed: Aug. 21, 2015

(86) PCT No.: PCT/CN2015/087728
§ 371 (c)(1),
(2) Date: Sep. 18, 2015

(51) Int. Cl.
*H01L 21/28* (2006.01)
*H01L 21/285* (2006.01)

(52) U.S. Cl.
CPC ... *H01L 21/28247* (2013.01); *H01L 21/28506* (2013.01)

(58) Field of Classification Search
CPC .............. H01L 21/28247; H01L 21/28506
See application file for complete search history.

(56) References Cited

U.S. PATENT DOCUMENTS

| | | | | |
|---|---|---|---|---|
| 2014/0145178 A1* | 5/2014 | Lee | ........ | H01L 29/66969 257/43 |
| 2014/0166197 A1* | 6/2014 | Chen | ........ | B32B 38/10 156/237 |
| 2015/0191358 A1* | 7/2015 | Choi | ........ | C01B 31/0453 428/201 |
| 2015/0275353 A1* | 10/2015 | Wang | ........ | C23C 14/165 204/192.17 |

FOREIGN PATENT DOCUMENTS

| CN | 102011100 A | 4/2011 |
|---|---|---|
| CN | 103579631 A | 2/2014 |

* cited by examiner

*Primary Examiner* — Mamadou Diallo
(74) *Attorney, Agent, or Firm* — Leong C. Lei

(57) ABSTRACT

The present invention provides a method for growing graphene on a surface of a gate electrode and a method for growing graphene on a surface of a source/drain electrode, in which a low-temperature plasma enhanced vapor deposition process is adopted to grow a graphene film, of which a film thickness is controllable, on a gate electrode or a source/drain electrode that contains copper, and completely coincides with a pattern of the gate electrode or the source/drain electrode. The manufacturing temperature of graphene is relatively low so that it is possible not to damage the structure of a thin-film transistor to the greatest extents and the supply of carbon sources that is used wide, having low cost and a simple manufacturing process, where existing PECVD facility of a thin-film transistor manufacturing line can be used without additional expense. The gate electrode or the source/drain electrode is covered with graphene and (Continued)

is prevented from contact with moisture and oxygen thereby overcoming the problem of a conventional TFT manufacturing process that a gate electrode or a source/drain electrode that contains copper is readily susceptible to oxidization. Further, the high electrical conductivity of graphene makes it possible not to affect the electrical performance of the entire device.

10 Claims, 6 Drawing Sheets

METHOD FOR GROWING GRAPHENE ON SURFACE OF GATE ELECTRODE AND METHOD FOR GROWING GRAPHENE ON SURFACE OF SOURCE/DRAIN SURFACE

BACKGROUND OF THE INVENTION

1. Field of the Invention

The present invention relates to the field of display technology, and in particular to a method for growing graphene on a surface of a gate electrode and a method for growing graphene on a surface of a source/drain electrode.

2. The Related Arts

In the field of display technology, flat panel displays, such as a liquid crystal display (LCD) and an organic light-emitting diode (OLED), have gradually taken the place of a cathode ray tube (CRT) display device and are widely used in liquid crystal televisions, mobile phones, personal digital assistants, digital cameras, computer displays, and notebook computer screens.

A display panel is an important constituent component of the LCD and OLED. The display panel of the LED and the display panel of the OLED both comprise a thin-film transistor (TFT) array substrate. Taking an LCD display panel as an example, it is made up of a TFT array substrate, a color filter (CF) substrate, and a liquid crystal layer interposed between the two substrates and the operation thereof is that a driving voltage is applied to the TFT array substrate and the CF substrate to control the liquid crystal molecules of the liquid crystal layer to rotate for refracting out light emitting from a backlight module to generate an image.

With continuous progress of the semiconductor display technology, display panel are required for increasingly heightened conductive performance for electrode wires on a TFT substrate array and the electrodes of a TFT. Particularly, in high-definition products, to increase aperture ratio, the width of electrode wires must be reduced provided the conductive performance can be maintained. In a large-sized product, to maintain the refreshing frequency of images, the electrical resistance of the electrode wires must be reduced. Since copper (Cu) materials have better electrical conductivity, Cu-based processes have been gradually introduced to the manufacturing of large-sized TFT-LCDs, in which the gate electrode and source/drain electrode are both formed of the Cu materials. In the conventional copper processes, to serve as the gate electrode and the source/drain electrode, copper must often be exposed for the performance of the subsequent processes and would be readily susceptible to oxidization in the subsequent high-temperature and high-humidity processes that leads to a non-conductive isolation layer on the surface of the copper thereby affecting the electrical performance of the entire TFT device. Thus, it is important to cover the surface of the copper with a high conductivity isolation layer to prevent the occurrence of the above-discussed problems.

Graphene is a single layer of carbon atoms having high electrical conductivity and also showing excellent mechanical property. Researches have proven a uniform and compact graphene layer can be formed on a surface of copper through vapor deposition processes. Since the single layer of graphene has excellent property of blocking moisture, it is can be used to prevent water and oxygen from contacting copper and protect copper from being oxidized. In a chemical vapor deposition (CVF) or plasma enhanced chemical vapor deposition (PECVD) process, microwave or radio frequency is used to ionize a gas that contains atoms for constructing a film for generating plasma in a local area. Since the plasma has extremely high chemical activity, reaction may readily occur to thereby deposit a desired film on a substrate. To allow the chemical reaction to occur at a relatively low temperature, the reaction is enhanced by means of the activity of the plasma. Such a chemical vapor deposition process is referred to as plasma enhanced chemical vapor deposition.

SUMMARY OF THE INVENTION

The object of the present invention is to provide a method for growing graphene on a surface of a gate electrode, which adopts a gaseous carbon source that is applied in a low temperature plasma enhanced chemical vapor deposition (PECVD) process to form a film-thickness-controllable graphene film on a surface of the gate electrode in order to reduce the risk of oxidization of the gate electrode, wherein the manufacturing temperature of graphene is relatively low so that it is possible not to damage the structure of a thin-film transistor to the greatest extents and the supply of carbon sources for graphene is wide, having low cost and a simple manufacturing process.

The object of the present invention is also to provide another method for growing graphene on a surface of a gate electrode, which adopts a solid-state carbon source that is applied in a low temperature PECVD process to grow a film-thickness-controllable graphene film on a surface of the gate electrode in order to reduce the risk of oxidization of the gate electrode, wherein the manufacturing temperature of graphene is relatively low so that it is possible not to damage the structure of a thin-film transistor to the greatest extents and the supply of carbon sources for graphene is wide, having low cost and simple manufacturing process.

The object of the present invention is further to provide a method for growing graphene on a surface of a source/drain electrode, which adopts a gaseous carbon source that is applied in a low temperature PECVD process to grow a film-thickness-controllable graphene film on a surface of the source/drain electrode in order to reduce the risk of oxidization of the source/drain electrode, wherein the manufacturing temperature of graphene is relatively low so that it is possible not to damage the structure of a thin-film transistor to the greatest extents and the supply of carbon sources for graphene is wide, having low cost and simple manufacturing process.

To achieve the above objects, the present invention provides a method for growing graphene on a surface of a gate electrode, comprising the following steps:

(1) providing a substrate that includes a gate electrode, wherein the gate electrode contains metallic copper;

(2) positioning the substrate that includes the gate electrode in a PECVD reaction chamber and introducing $H_2$ gas for cleaning, increasing a temperature inside the PECVD reaction chamber to 300° C.-700° C., a gas flow rate of $H_2$ gas being 10 SCCM to 200 SCCM, an overall pressure of the PECVD reaction chamber being kept between 1 to 10 Pa, radio frequency (RF) power being 100-800 W; and (3) continuously introducing $H_2$ gas into the PECVD reaction chamber and simultaneously introducing a hydrocarbon gas so as to grow graphene on a surface of the gate electrode, wherein a ratio of flow rate between the hydrocarbon gas and $H_2$ gas is between 10:1 and 1:50, growth time of graphene being controlled within 1-10 min, then shutting down the PECVD facility to have the facility return to room temperature, thereby obtaining a graphene film covering the surface of the gate electrode.

In step (2), the gas flow rate of the H$_2$ gas is 80 SCCM; the overall pressure of the PECVD reaction chamber is kept at 3 Pa; the RF power applied in the PECVD reaction chamber is 500 W; and the temperature of the PECVD reaction chamber is increased to 500° C.

In step (3), the hydrocarbon gas comprises methane, ethane, or ethylene and a pattern of the graphene film formed in step (3) completely coincides with a pattern of the gate electrode.

The present invention also provides another method for growing graphene on a surface of a gate electrode, comprising the following steps:

(1) providing a substrate that includes a gate electrode, wherein the gate electrode contains metallic copper;

(2) providing a solid-state carbon source and a solvent, dissolving the solid-state carbon source in the solvent to form a mixture solution, uniformly coating the mixture solution on the substrate that includes the gate electrode to form an organic film covering the gate electrode and the substrate, followed by baking at 50° C.-100° C. in vacuum for 1-4 h to remove the solvent within the organic film; and (3) positioning the substrate that is covered with the organic film in a PECVD reaction chamber, introducing H$_2$ gas, wherein a flow rate of H$_2$ gas is 10-200 SCCM, increasing a temperature inside the PECVD reaction chamber to 400° C.-700° C., an overall pressure of the PECVD reaction chamber being kept at 23 Torr, wherein the solid-state carbon source of the organic film is converted in the PECVD reaction chamber into graphene and reaction time is 5-60 min, then the supply of H$_2$ gas is cut off and the PECVD facility shut down to have the facility return to room temperature, thereby obtaining a graphene film covering the surface of the gate electrode of the substrate.

In step (2), the solid-state carbon source comprises polymethyl methacrylate, polystyrene, polyacrylonitrile, or polydimethylsiloxane and the solvent comprises toluene; and in step (2), coating is achieved with spin-coating, slot-coating, or spray-coating.

In step (3), the temperature inside the PECVD reaction chamber is increased to 600° C.; the flow rate of H$_2$ gas is 100 SCCM; the reaction time of the organic film in he PECVD reaction chamber is 20 min; and a pattern of the graphene film formed in step (3) completely coincides with a pattern of the gate electrode.

The present invention further provides a method for growing graphene on a surface of a source/drain electrode, comprising the following steps:

(1) providing a substrate that includes a source/drain electrode, wherein the source/drain electrode contains metallic copper;

(2) positioning the substrate that includes the source/drain electrode in a PECVD reaction chamber and introducing H$_2$ gas for cleaning, increasing a temperature inside the PECVD reaction chamber to 300° C.-400° C., a gas flow rate of H$_2$ gas being 10 SCCM to 200 SCCM, an overall pressure of the PECVD reaction chamber being kept between 1 to 10 Pa, RF power being 100-800 W; and (3) continuously introducing H$_2$ gas into the PECVD reaction chamber and simultaneously introducing a hydrocarbon gas so as to grow graphene on a surface of the source/drain electrode, wherein a ratio of flow rate between the hydrocarbon gas and H$_2$ gas is between 10:1 and 1:50, growth time of graphene being controlled within 1-10 min, then shutting down the PECVD facility to have the facility return to room temperature, thereby obtaining a graphene film covering the surface of the source/drain electrode.

In step (1), the substrate that includes the source/drain electrode comprises a substrate, a gate electrode formed on the substrate, a gate insulation layer formed on the gate electrode and covering the gate electrode, a semiconductor layer formed on the gate insulation layer, and a source/drain electrode formed on the semiconductor layer.

The substrate that includes the source/drain electrode further comprises a graphene film formed on the gate electrode and covering the gate electrode.

In step (3), the hydrocarbon gas comprises methane, ethane, or ethylene; and the graphene film formed in step (3) has a pattern that completely coincides with a pattern of the source/drain electrode.

The efficacy of the present invention is that the present invention provides a method for growing graphene on a surface of a gate electrode and a method for growing graphene on a surface of a source/drain electrode, in which a low-temperature plasma enhanced vapor deposition process is adopted to grow a graphene film, of which a film thickness is controllable, on a gate electrode or a source/drain electrode that contains copper, and completely coincides with a pattern of the gate electrode or the source/drain electrode. The manufacturing temperature of graphene is relatively low so that it is possible not to damage the structure of a thin-film transistor to the greatest extents and the supply of carbon sources that is used wide, having low cost and a simple manufacturing process, where existing PECVD facility of a thin-film transistor manufacturing line can be used without additional expense. The gate electrode or the source/drain electrode is covered with graphene and is prevented from contact with moisture and oxygen thereby overcoming the problem of a conventional TFT manufacturing process that a gate electrode or a source/drain electrode that contains copper is readily susceptible to oxidization. Further, the high electrical conductivity of graphene makes it possible not to affect the electrical performance of the entire device.

BRIEF DESCRIPTION OF THE DRAWINGS

The features and technical contents of the present invention will be apparent from the following detailed description of the present invention and the attached drawing; however, these drawings are provided for reference and illustration and are not intended to limit the scope of the present invention. In the drawing.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Taking into consideration the requirement for temperature in the manufacture of a thin-film transistor liquid crystal display (TFT-LCD), the present invention employs a low-temperature plasma enhanced chemical vapor deposition (PECVD) to grow a film-thickness-controllable graphene film on a surface of a gate electrode or a source/drain electrode that contains copper and allows graphene to grow according to a pattern of the gate electrode or source/drain electrode. Specifically speaking, in the entire process of reaction, copper contained in the gate electrode or the source/drain electrode plays a role of catalyst so that carbon-contained precursors decompose on a surface of copper to form nuclei and get crystalized, while such a reaction does not occur in other areas that contain no copper. This helps prevent graphene from contaminating the other portions. After the gate electrode or source/drain electrode is covered by graphene, due to protection achieved with graphene, the gate electrode or source/drain electrode is protected from contact with moisture and oxygen. In addition, the high electrical conductivity of graphene makes it possible not to affect the electrical performance of the entire device.

Figure 1:
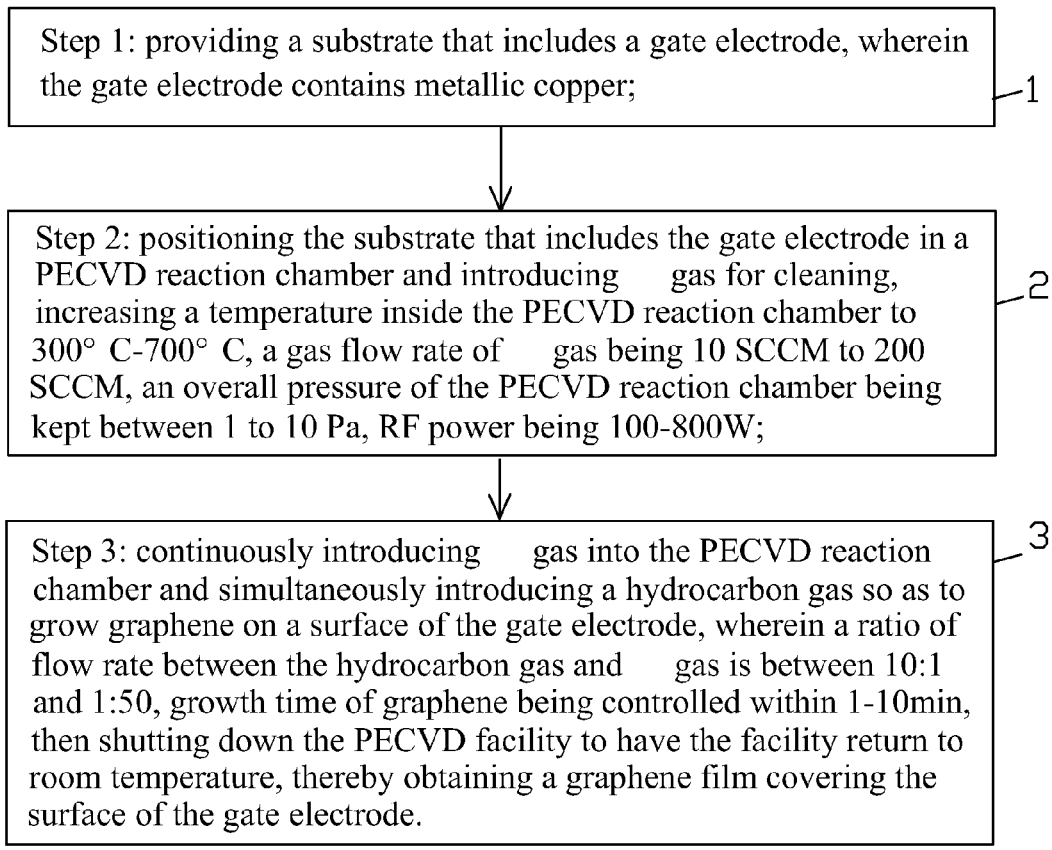
FIG. 1 is a flow chart illustrating a method for growing graphene on a surface of a gate electrode according to the present invention.

Based on the above principle, referring to FIG. 1, firstly, the present invention provides a method for growing graphene on a surface of a gate electrode, which comprises the following steps:

Step 1: providing a substrate that includes a gate electrode 12, wherein the gate electrode 12 contains metallic copper.

Figure 2:
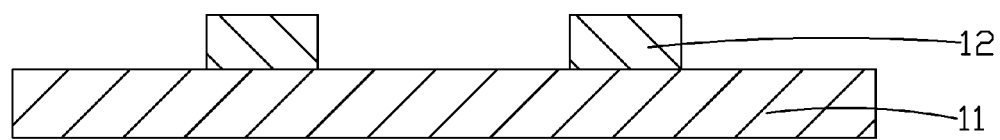
FIG. 2 is a schematic view illustrating a first step of the method for growing graphene on a surface of a gate electrode of FIG. 1.
Figure 3:
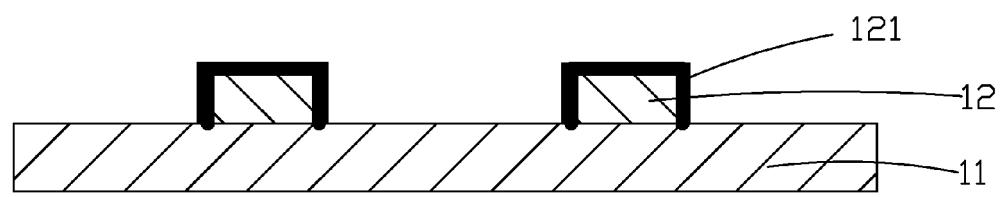
FIG. 3 is a schematic view illustrating a fourth step of the method for growing graphene on a surface of a gate electrode of FIG. 1.

Specifically, as shown in FIG. 2, the substrate that includes a gate electrode 12 comprises a substrate 11 and a gate electrode 12 formed on the substrate 11.

Specifically, the gate electrode 12 can be of a single-layer structure or a double-layer structure. The single-layer structure can be a single copper layer or copper alloy layer. The double-layer structure can be a double-layered composite structure comprising an aluminum layer and a copper layer, a double-layered composite structure comprising a molybdenum layer and a copper layer, or a double-layered composite structure comprising a titanium layer and a copper layer.

Step 2: positioning the substrate that includes the gate electrode 12 in a plasma enhanced chemical vapor deposition (PECVD) reaction chamber and introducing $H_2$ (hydrogen) gas for cleaning, increasing a temperature inside the PECVD reaction chamber to 300° C.-700° C., a gas flow rate of $H_2$ gas being 10 SCCM to 200 SCCM, an overall pressure of the PECVD reaction chamber being kept between 1 to 10 Pa, radio frequency (RF) power being 100-800 W.

Specifically, $H_2$ gas is ionized in the PECVD reaction chamber to form H plasma so as to achieve an effect of cleaning the substrate.

Preferably, the gas flow rate of $H_2$ gas is 80 SCCM.

Preferably, the overall pressure of the PECVD reaction chamber is kept at 3 Pa.

Preferably, the RF power applied in the PECVD reaction chamber is 500 W.

Preferably, the temperature inside the PECVD reaction chamber is increased to 500° C.

Specifically, the PECVD facility used in the present invention can be regular PECVD facility or improved PECVD facility, such as microwave enhanced PECVD facility or surface wave enhanced PECVD facility.

Step 3: as shown in FIG. 2, continuously introducing $H_2$ gas into the PECVD reaction chamber and simultaneously introducing a hydrocarbon gas so as to grow graphene on a surface of the gate electrode 12, wherein a ratio of flow rate between the hydrocarbon gas and $H_2$ gas is between 10:1 and 1:50, growth time of graphene being controlled within 1-10 min, then shutting down the PECVD facility to have the facility return to room temperature, thereby obtaining a graphene film 121 covering the surface of the gate electrode 12.

Specifically, the hydrocarbon gas comprises methane, ethane, or ethylene.

Preferably, the ratio of flow rate between the hydrocarbon gas and $H_2$ gas is 3:1.

Preferably, the growth time of graphene is controlled to be 3 min.

Specifically, in the reaction of Step 3, metallic copper contained in the gate electrode 12 provides an effect of catalyst and the hydrocarbon gas decomposes on a surface of copper to nucleate and crystalize and thus form the graphene film, while in areas other than the gate electrode 12, since there is no metallic copper, no such a reaction may occur. This helps prevent graphene from contaminating the other portions and makes graphene growing according to a pattern of the gate electrode 12 so that the finally obtained pattern of the graphene film 121 completely coincides with the pattern of the gate electrode 12.

Figure 4:
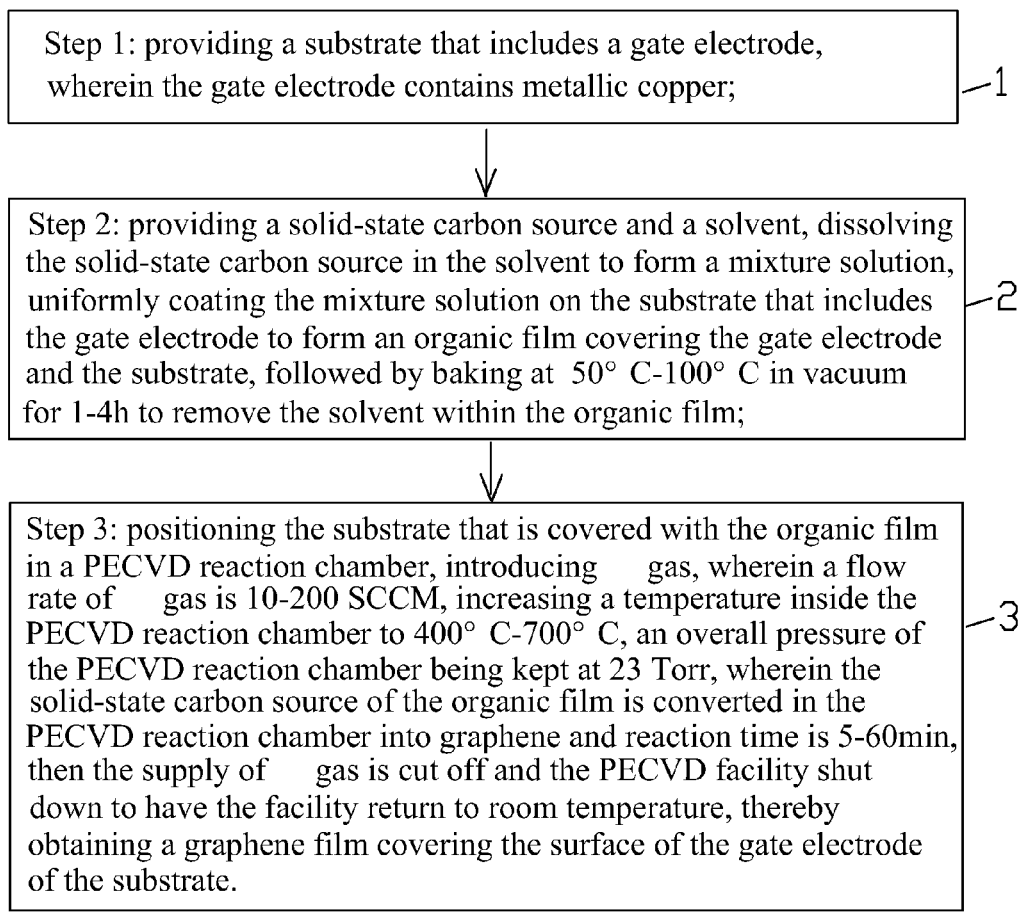
FIG. 4 is a flow chart illustrating another method for growing graphene on a surface of a gate electrode according to the present invention.

Referring to FIG. 4, the present invention also provides another method for growing graphene on a surface of a gate electrode, which comprises the following steps:

Step 1: providing a substrate that includes a gate electrode, wherein the gate electrode contains metallic copper.

Specifically, the substrate that includes a gate electrode comprises a substrate and a gate electrode formed on the substrate.

Specifically, the gate electrode can be of a single-layer structure or a double-layer structure. The single-layer structure can be a single copper layer or copper alloy layer. The double-layer structure can be of a double-layered composite structure comprising an aluminum layer and a copper layer, a double-layered composite structure comprising a molybdenum layer and a copper layer, or a double-layered composite structure comprising a titanium layer and a copper layer.

Step 2: providing a solid-state carbon source and a solvent, dissolving the solid-state carbon source in the solvent to form a mixture solution, uniformly coating the mixture solution on the substrate that includes the gate electrode to form an organic film covering the gate electrode and the substrate, followed by baking at 50° C.-100° C. in vacuum for 1-4 h to remove the solvent within the organic film.

Specifically, the solid-state carbon source can be a carbon-contained organic substance, such as polymethyl methacrylate (PMMA), polystyrene (PS), polyacrylonitrile (PAN), or polydimethylsiloxane (PDMS) and the solvent can be an organic solvent, such as toluene.

Specifically, the coating of Step 2 can be achieved with a wet coating process, such as spin-coating, slot-coating, or spray-coating.

Step 3: positioning the substrate that is covered with the organic film in a PECVD reaction chamber, introducing $H_2$ gas, wherein a flow rate of $H_2$ gas is 10-200 SCCM, increasing a temperature inside the PECVD reaction chamber to 400° C.-700° C., an overall pressure of the PECVD reaction chamber being kept at 23 Torr, wherein the solid-state carbon source of the organic film is converted in the PECVD reaction chamber into graphene and reaction time is 5-60 min, then the supply of $H_2$ gas is cut off and the PECVD facility shut down to have the facility return to room temperature, thereby obtaining a graphene film covering the surface of the gate electrode of the substrate.

Preferably, in Step 3, the temperature inside the PECVD reaction chamber is increased to 600° C.

Preferably, the flow rate of $H_2$ gas is 100 SCCM.

Preferably, the reaction time of the organic film in he PECVD reaction chamber is 20 min.

Specifically, the PECVD facility used in the present invention can be regular PECVD facility or improved PECVD facility, such as microwave enhanced PECVD facility or surface wave enhanced PECVD facility.

Specifically, in the reaction of Step 3, metallic copper contained in the gate electrode provides an effect of catalyst and the solid-state carbon source within the organic film decomposes on a surface of copper to nucleate and crystalize and thus form the graphene film, while in areas other than the gate electrode, since there is no metallic copper, no such a reaction may occur. This helps prevent graphene from contaminating the other portions and makes graphene to grow according to a pattern of the gate electrode so that the finally obtained pattern of the graphene film completely coincides with the pattern of the gate electrode.

Figure 5:
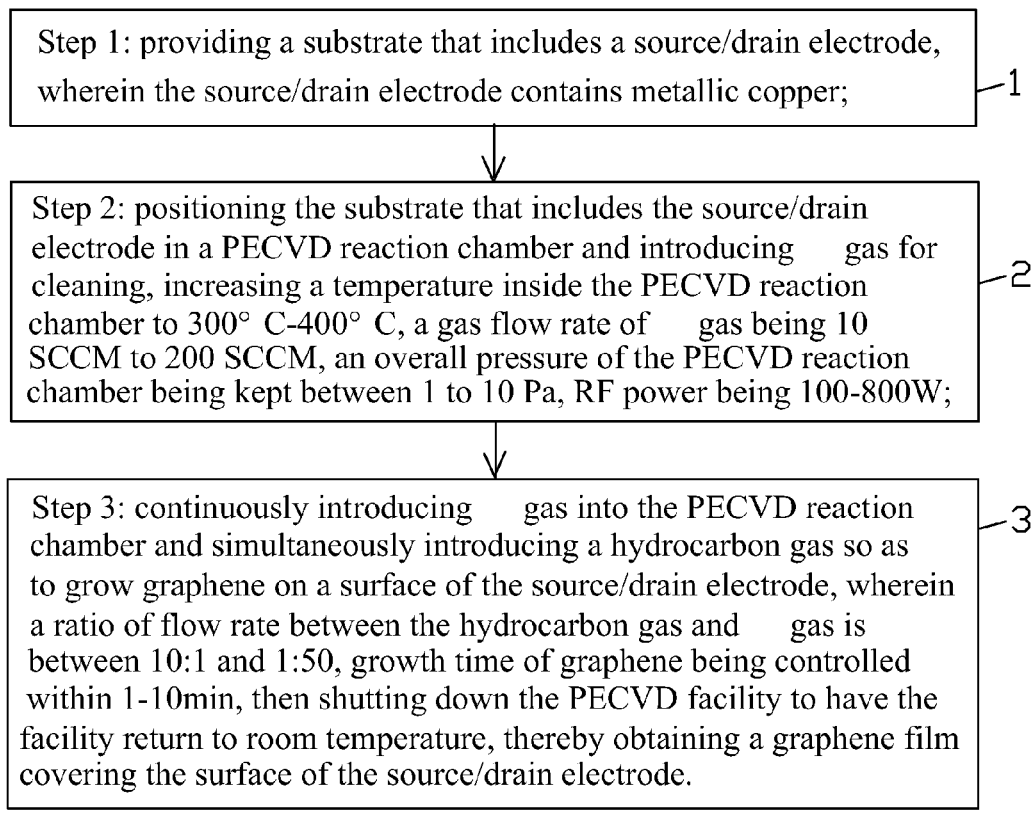
FIG. 5 is a flow chart illustrating a method for growing graphene on a surface of a source/drain electrode according to the present invention.
Figure 6:
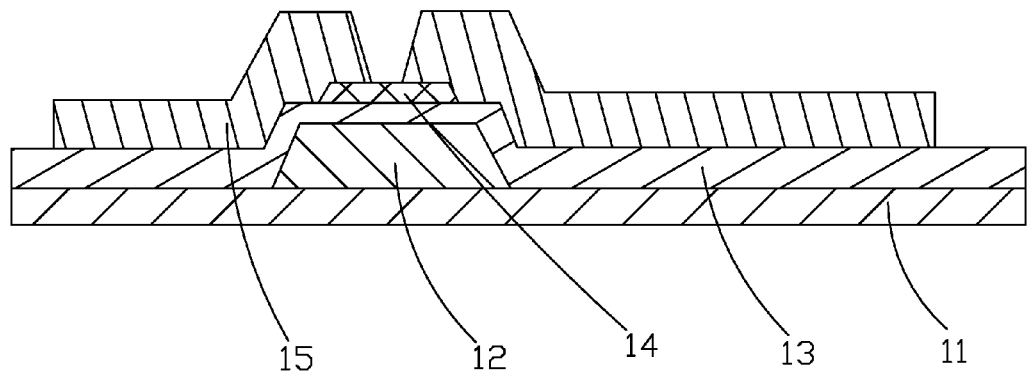
FIGS. 6-7 are schematic views illustrating a first step of the method for growing graphene on a surface of a source/drain electrode of FIG. 5.
Figure 7:
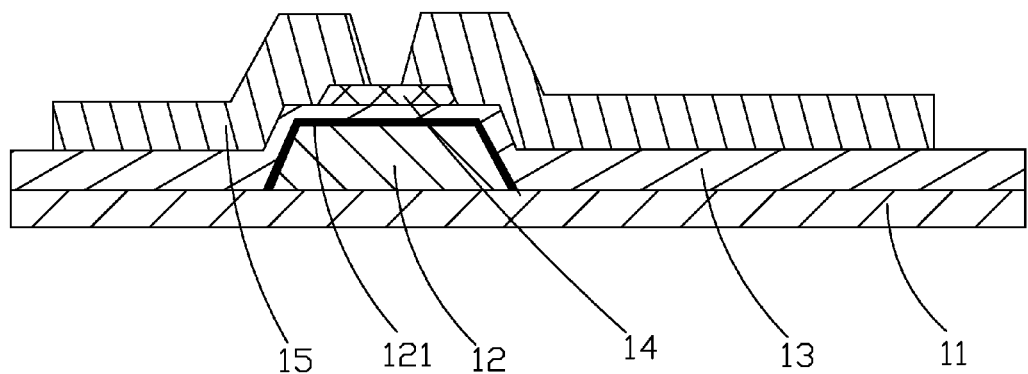

Referring to FIG. 5, the present invention also provides a method for growing graphene on a surface of a source/drain electrode, which comprises the following steps:

Step 1: as shown in FIGS. 6-7, providing a substrate that includes a source/drain electrode, wherein the source/drain electrode 15 contains metallic copper.

Specifically, as shown in FIG. 6, the substrate that includes a source/drain electrode 15 comprises a substrate 11, a gate electrode 12 formed on the substrate 11, a gate insulation layer 13 formed on the gate electrode 12 and covering the gate electrode 12, a semiconductor layer 14 formed on the gate insulation layer 13, and a source/drain electrode 15 formed on the semiconductor layer 14.

Further, as shown in FIG. 7, the substrate that includes a source/drain electrode 15 may further comprise a graphene film 121 formed on the gate electrode 12 and covering the gate electrode 12. Specifically, the graphene film 121 is made with one of the two methods for growing graphene on a surface of a gate electrode described above.

Specifically, the source/drain electrode 15 can be a single-layer structure or a double-layer structure. The single-layer structure can be a single copper layer or copper alloy layer. The double-layer structure can be a double-layered composite structure comprising an aluminum layer and a copper layer, a double-layered composite structure comprising a molybdenum layer and a copper layer, or a double-layered composite structure comprising a titanium layer and a copper layer.

Step 2: positioning the substrate that includes the source/drain electrode 15 in a PECVD reaction chamber and introducing $H_2$ gas for cleaning, increasing a temperature inside the PECVD reaction chamber to 300° C.-400° C., a gas flow rate of $H_2$ gas being 10 SCCM to 200 SCCM, an overall pressure of the PECVD reaction chamber being kept between 1 to 10 Pa, radio frequency (RF) power being 100-800 W.

Since a TFT structure has been formed before the growth of graphene on the source/drain electrode 15, formation of the graphene film with the PECVD precess may use a relatively low temperature, 300° C.-400° C., in order to prevent damage to the already-formed TFT structure.

Preferably, the gas flow rate of $H_2$ gas is 80 SCCM.

Preferably, the overall pressure of the PECVD reaction chamber is kept at 3 Pa.

Preferably, the RF power applied in the PECVD reaction chamber is 500 W.

Specifically, the PECVD facility used in the present invention can be regular PECVD facility or improved PECVD facility, such as microwave enhanced PECVD facility or surface wave enhanced PECVD facility.

Figure 8:
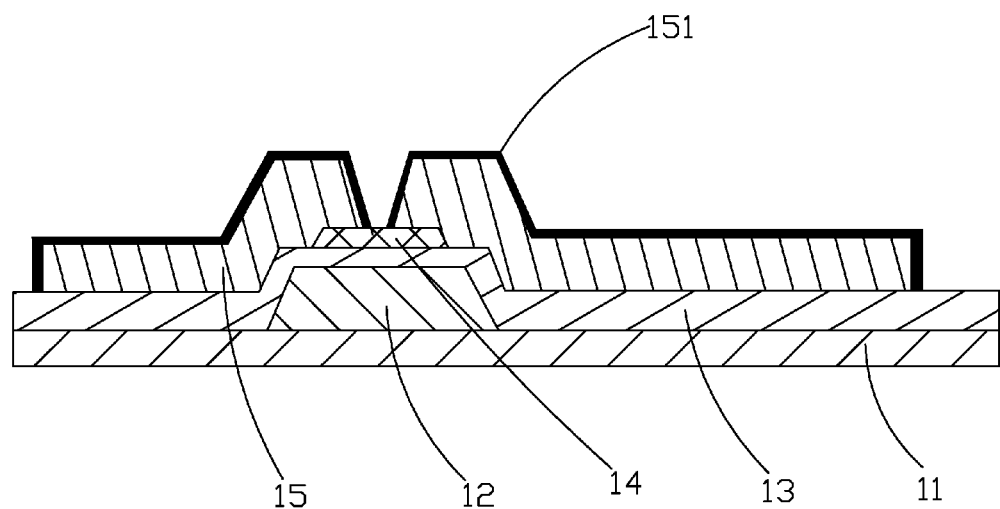
FIGS. 8-9 are schematic views illustrating a second step of the method for growing graphene on a surface of a source/drain electrode of FIG. 5.
Figure 9:
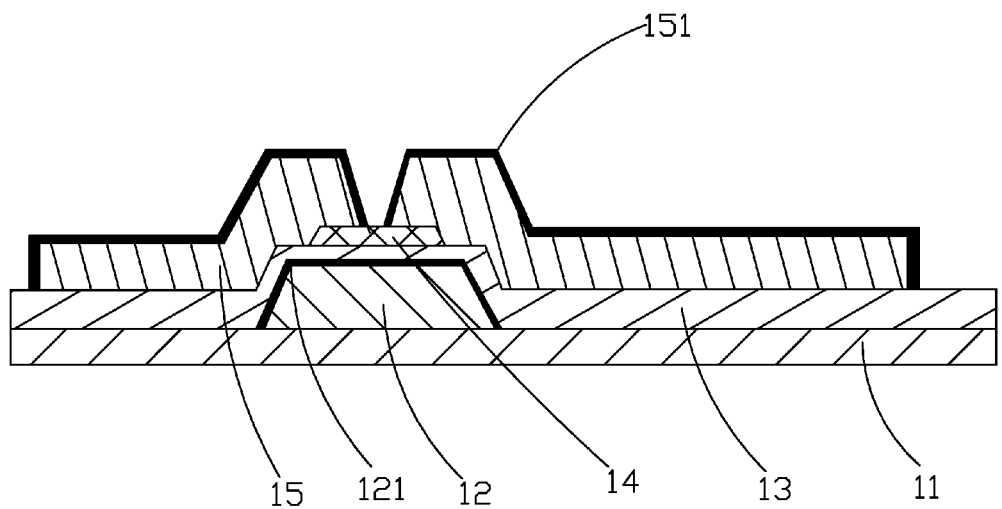

Step 3: continuously introducing $H_2$ gas into the PECVD reaction chamber and simultaneously introducing a hydrocarbon gas so as to grow graphene on a surface of the source/drain electrode 15, wherein a ratio of flow rate between the hydrocarbon gas and $H_2$ gas is between 10:1 and 1:50, growth time of graphene being controlled within 1-10 min, then shutting down the PECVD facility to have the facility return to room temperature, thereby obtaining a graphene film 151 covering the surface of the source/drain electrode 15, as shown in FIGS. 8 and 9.

Specifically, $H_2$ gas is ionized in the PECVD reaction chamber to form H plasma so as to achieve an effect of cleaning the substrate.

Specifically, the hydrocarbon gas comprises methane, ethane, or ethylene.

Preferably, the ratio of flow rate between the hydrocarbon gas and $H_2$ gas is 3:1.

Preferably, the growth time of graphene is controlled to be 3 min.

Specifically, in the reaction of Step 3, metallic copper contained in the source/drain electrode 15 provides an effect of catalyst and the hydrocarbon gas decomposes on a surface of copper to nucleate and crystalize and thus form the graphene film, while in areas other than the source/drain electrode 15, since there is no metallic copper, no such a reaction may occur. This helps prevent graphene from contaminating the other portions and makes graphene growing according to a pattern of the source/drain electrode 15 so that the finally obtained pattern of the graphene film 151 completely coincides with the pattern of the source/drain electrode 15.

In summary, the present invention provides a method for growing graphene on a surface of a gate electrode and a method for growing graphene on a surface of a source/drain electrode, in which a low-temperature plasma enhanced vapor deposition process is adopted to grow a graphene film, of which a film thickness is controllable, on a gate electrode or a source/drain electrode that contains copper, and completely coincides with a pattern of the gate electrode or the source/drain electrode. The manufacturing temperature of graphene is relatively low so that it is possible not to damage the structure of a thin-film transistor to the greatest extents and the supply of carbon sources that is used wide, having low cost and a simple manufacturing process, where existing PECVD facility of a thin-film transistor manufacturing line can be used without additional expense. The gate electrode or the source/drain electrode is covered with graphene and is prevented from contact with moisture and oxygen thereby overcoming the problem of a conventional TFT manufacturing process that a gate electrode or a source/drain electrode that contains copper is readily susceptible to oxidization. Further, the high electrical conductivity of graphene makes it possible not to affect the electrical performance of the entire device.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A method for growing graphene on a surface of a gate electrode, comprising the following steps:
   (1) providing a substrate that includes a gate electrode, wherein the gate electrode contains metallic copper;
   (2) positioning the substrate that includes the gate electrode in a plasma enhanced chemical vapor deposition (PECVD) reaction chamber and introducing $H_2$ gas for cleaning, increasing a temperature inside the PECVD reaction chamber to 300° C.-700° C., a gas flow rate of $H_2$ gas being 10 SCCM to 200 SCCM, an overall pressure of the PECVD reaction chamber being kept between 1 to 10 Pa, radio frequency (RF) power being 100-800 W; and
   (3) continuously introducing $H_2$ gas into the PECVD reaction chamber and simultaneously introducing a hydrocarbon gas so as to grow graphene on a surface of the gate electrode, wherein a ratio of flow rate between the hydrocarbon gas and $H_2$ gas is between 10:1 and 1:50, growth time of graphene being controlled within 1-10 min, then shutting down the PECVD facility to have the facility return to room temperature, thereby obtaining a graphene film covering the surface of the gate electrode.

2. The method for growing graphene on a surface of a gate electrode as claimed in claim 1, wherein in step (2), the gas flow rate of the $H_2$ gas is 80 SCCM; the overall pressure of the PECVD reaction chamber is kept at 3 Pa; the RF power applied in the PECVD reaction chamber is 500 W; and the temperature of the PECVD reaction chamber is increased to 500° C.

3. The method for growing graphene on a surface of a gate electrode as claimed in claim 1, wherein in step (3), the hydrocarbon gas comprises methane, ethane, or ethylene and a pattern of the graphene film formed in step (3) completely coincides with a pattern of the gate electrode.

4. A method for growing graphene on a surface of a gate electrode, comprising the following steps:
   (1) providing a substrate that includes a gate electrode, wherein the gate electrode contains metallic copper;
   (2) providing a solid-state carbon source and a solvent, dissolving the solid-state carbon source in the solvent to form a mixture solution, uniformly coating the mixture solution on the substrate that includes the gate electrode to form an organic film covering the gate electrode and the substrate, followed by baking at 50° C.-100° C. in vacuum for 1-4 h to remove the solvent within the organic film; and
   (3) positioning the substrate that is covered with the organic film in a plasma enhanced chemical vapor deposition (PECVD) reaction chamber, introducing $H_2$ gas, wherein a flow rate of $H_2$ gas is 10-200 SCCM, increasing a temperature inside the PECVD reaction chamber to 400° C.-700° C., an overall pressure of the PECVD reaction chamber being kept at 23 Torr, wherein the solid-state carbon source of the organic film is converted in the PECVD reaction chamber into graphene and reaction time is 5-60 min, then the supply of $H_2$ gas is cut off and the PECVD facility shut down to have the facility return to room temperature, thereby obtaining a graphene film covering the surface of the gate electrode of the substrate.

5. The method for growing graphene on a surface of a gate electrode as claimed in claim 4, wherein in step (2), the solid-state carbon source comprises polymethyl methacrylate, polystyrene, polyacrylonitrile, or polydimethylsiloxane and the solvent comprises toluene; and in step (2), coating is achieved with spin-coating, slot-coating, or spray-coating.

6. The method for growing graphene on a surface of a gate electrode as claimed in claim 4, wherein in step (3), the temperature inside the PECVD reaction chamber is increased to 600° C.; the flow rate of $H_2$ gas is 100 SCCM; the reaction time of the organic film in he PECVD reaction chamber is 20 min; and a pattern of the graphene film formed in step (3) completely coincides with a pattern of the gate electrode.

7. A method for growing graphene on a surface of a source/drain electrode, comprising the following steps:
   (1) providing a substrate that includes a source/drain electrode, wherein the source/drain electrode contains metallic copper;
   (2) positioning the substrate that includes the source/drain electrode in a plasma enhanced chemical vapor deposition (PECVD) reaction chamber and introducing $H_2$ gas for cleaning, increasing a temperature inside the PECVD reaction chamber to 300° C.-400° C., a gas flow rate of $H_2$ gas being 10 SCCM to 200 SCCM, an overall pressure of the PECVD reaction chamber being kept between 1 to 10 Pa, radio frequency (RF) power being 100-800 W; and
   (3) continuously introducing $H_2$ gas into the PECVD reaction chamber and simultaneously introducing a hydrocarbon gas so as to grow graphene on a surface of the source/drain electrode, wherein a ratio of flow rate between the hydrocarbon gas and $H_2$ gas is between 10:1 and 1:50, growth time of graphene being controlled within 1-10 min, then shutting down the PECVD facility to have the facility return to room temperature, thereby obtaining a graphene film covering the surface of the source/drain electrode.

8. The method for growing graphene on a surface of a source/drain electrode as claimed in claim 7, wherein in step (1), the substrate that includes the source/drain electrode comprises a substrate, a gate electrode formed on the substrate, a gate insulation layer formed on the gate electrode and covering the gate electrode, a semiconductor layer formed on the gate insulation layer, and a source/drain electrode formed on the semiconductor layer.

9. The method for growing graphene on a surface of a source/drain electrode as claimed in claim 8, wherein the substrate that includes the source/drain electrode further comprises a graphene film formed on the gate electrode and covering the gate electrode.

10. The method for growing graphene on a surface of a source/drain electrode as claimed in claim 7, wherein in step (3), the hydrocarbon gas comprises methane, ethane, or ethylene; and the graphene film formed in step (3) has a pattern that completely coincides with a pattern of the source/drain electrode.

* * * * *